US009356073B1

(12) United States Patent
Kim

(10) Patent No.: US 9,356,073 B1
(45) Date of Patent: May 31, 2016

(54) SEMICONDUCTOR DEVICE INCLUDING AIR GAPS AND METHOD OF FABRICATING THE SAME

(71) Applicant: SK hynix Inc., Gyeonggi-do (KR)

(72) Inventor: Min-Ho Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/716,534

(22) Filed: May 19, 2015

(30) Foreign Application Priority Data

Jan. 19, 2015 (KR) ........................ 10-2015-0008562

(51) Int. Cl.
| | |
|---|---|
| *H01L 23/48* | (2006.01) |
| *H01L 23/522* | (2006.01) |
| *H01L 27/108* | (2006.01) |
| *H01L 21/768* | (2006.01) |
| *H01L 21/764* | (2006.01) |
| *H01L 27/24* | (2006.01) |
| *H01L 23/532* | (2006.01) |
| *H01L 23/535* | (2006.01) |
| *H01L 23/528* | (2006.01) |
| *H01L 29/423* | (2006.01) |
| *H01L 21/311* | (2006.01) |
| *H01L 21/762* | (2006.01) |

(52) U.S. Cl.
CPC .......... *H01L 27/2436* (2013.01); *H01L 21/764* (2013.01); *H01L 21/7682* (2013.01); *H01L 21/76831* (2013.01); *H01L 21/76834* (2013.01); *H01L 23/528* (2013.01); *H01L 23/535* (2013.01); *H01L 23/5329* (2013.01); *H01L 27/10814* (2013.01); *H01L 27/10823* (2013.01); *H01L 27/10855* (2013.01); *H01L 27/10885* (2013.01); *H01L 27/10888* (2013.01); *H01L 29/4236* (2013.01)

(58) Field of Classification Search
CPC .............. H01L 21/7682; H01L 21/764; H01L 21/76897; H01L 21/76831; H01L 27/10855; H01L 27/10814; H01L 27/10823; H01L 27/10885
See application file for complete search history.

(56) References Cited

U.S. PATENT DOCUMENTS

| | | | | |
|---|---|---|---|---|
| 9,214,382 | B2 * | 12/2015 | Lee ........................ | H01L 21/764 |
| 2012/0276711 | A1 * | 11/2012 | Yoon ..................... | H01L 21/764 438/421 |
| 2013/0292847 | A1 | 11/2013 | Choi et al. | |
| 2015/0187644 | A1 * | 7/2015 | Kim .................. | H01L 21/76855 257/774 |
| 2015/0214291 | A1 * | 7/2015 | Park ....................... | H01L 24/02 257/503 |
| 2015/0255466 | A1 * | 9/2015 | Hwang ............. | H01L 21/02164 438/586 |

(Continued)

FOREIGN PATENT DOCUMENTS

KR      1020090044669      5/2009

*Primary Examiner* — Victor A Mandala
*Assistant Examiner* — Regan J Rundio
(74) *Attorney, Agent, or Firm* — IP & T Group LLP

(57) ABSTRACT

A semiconductor device including air gaps and a method of fabricating the same. The semiconductor device in accordance with an embodiment may include a bit line structure having a bit line formed over a first contact plug, a second contact plug formed adjacent to the first contact plug and the bit line structure, an air gap structure comprising two or more air gaps to surround the second contact plug and have an outer sidewall in contact with the bit line structure, and one or more capping support layers separating the air gaps, a third contact plug capping a part of the air gap structure and being formed over the second contact plug, and a capping layer for capping a remainder of the air gap structure.

16 Claims, 15 Drawing Sheets

(56) References Cited

U.S. PATENT DOCUMENTS

2016/0005743 A1* 1/2016 Lim .................. H01L 23/48
    438/586

2016/0027727 A1* 1/2016 Kim .................. H01L 23/528
    257/774

* cited by examiner

SEMICONDUCTOR DEVICE INCLUDING AIR GAPS AND METHOD OF FABRICATING THE SAME

CROSS-REFERENCE TO RELATED APPLICATIONS

This patent document claims priority of Korean Patent Application No. 10-2015-0008562, filed on Jan. 19, 2015, which is incorporated herein by reference in its entirety.

BACKGROUND

Exemplary embodiments of the present invention relate to a technology for fabricating a semiconductor device and, more particularly, to a semiconductor device including air gaps and a method of fabricating the same.

Semiconductor devices generally include insulating materials between adjacent conductive structures. As the degree of integration of semiconductor devices is increased, the distance between adjacent conductive structures is reduced. As the distance between adjacent conductive structures is reduced, parasitic capacitance increases, leading to poor performance.

Parasitic capacitance may be reduced when the dielectric constant of the insulating material formed between the conductive structures is lowered, but the reduction in parasitic capacitance is limited because insulating materials generally have high dielectric constants.

SUMMARY

Various embodiments are directed to the provision of a semiconductor device capable of reducing parasitic capacitance between adjacent conductive structures and a method of fabricating the same.

In an embodiment, a semiconductor device may include a bit line structure including a bit line formed over a first contact plug, a second contact plug formed adjacent to the first contact plug and the bit line structure, an air gap structure including two or more air gaps to surround the second contact plug and having an outer sidewall in contact with the bit line structure, and one or more capping support layers separating the air gaps, a third contact plug suitable for capping a part of the air gap structure and is formed over the second contact plug, and a capping layer suitable for capping a remainder of the air gap structure.

The two or more air gaps and the one or more capping support layers of the air gap structure may have a ring-shaped structure. The two or more air gaps of the air gap structure may have the same width, and the width of the air gap may be increased as the air gap moves further away from the second contact plug. The capping support layer may include an insulating substance. The bottom part of the second contact plug may be laterally extended. The semiconductor device may further include a plug spacer formed over sidewalls of the first contact plug which face sidewalls of the second contact plug. A top surface of the plug spacer may be positioned at a level equal to or lower than a top surface of the first contact plug. The semiconductor device may further include a buried gate type transistor having a source region and a drain region respectively coupled to the first contact plug and the second contact plug, and a memory element coupled to the third contact plug. The memory element may include a capacitor or a variable resistance element.

In an embodiment, a semiconductor device may include a bit line structure including a bit line formed over a first contact plug, a second contact plug formed adjacent to the first contact plug and the bit line structure, a first air gap having a ring-shaped structure and surrounding the second contact plug, a second air gap having a ring-shaped structure to surround the first air gap and having an outer sidewall in contact with the bit line structure, a capping support layer having a ring-shaped structure to surround the first air gap, and separating the first air gap from the second air gap, a third contact plug suitable for capping a part of the first air gap and the second air gap, and is formed over the second contact plug, a capping layer suitable for capping a remainder of the first air gap and the second air gap, and a memory element coupled to the third contact plug.

A width of the first air gap may be equal to or less than a width of the second air gap. The capping support layer may include an insulating substance. The bottom part of the second contact plug may be laterally extended. The semiconductor device may further include a plug spacer formed over sidewalls of the first contact plug which face sidewalls of the second contact plug. A top surface of the plug spacer may be positioned at a level equal to or lower than a top surface of the first contact plug. The memory element comprises a capacitor or a variable resistance element.

In an embodiment, a method of fabricating a semiconductor device may include forming a first interlayer dielectric layer comprising a first open part over a substrate, forming a first contact plug to fill the first open part and forming a bit line structure comprising a bit line over the first contact plug, forming a second interlayer dielectric layer over a resultant structure including the bit line structure, forming a second open part of a hole-shaped structure which has sidewalls provided by the second interlayer dielectric layer and the bit line structure, by etching the second interlayer dielectric layer, sequentially forming a first sacrificial spacer, a capping support layer, and a second sacrificial spacer over the sidewalls of the second open part, forming a second contact plug to partially fill the second open part, forming a first air gap surrounding the second contact plug by removing the second sacrificial spacer, forming a third interlayer dielectric layer over a resultant structure including the second contact plug, forming a third open part to partially expose the second contact plug and the first sacrificial spacer by etching the third interlayer dielectric layer, forming a second air gap surrounding the second contact plug by removing the first sacrificial spacer, and forming a third contact plug to fill the third open part.

The forming of the first contact plug and the bit line structure may include forming a preliminary-first contact plug to fill the first open part, forming the bit line structure comprising the bit line over the preliminary-first contact plug, and forming the first contact plug spaced apart from sidewalls of the first open part with a gap by etching the preliminary-first contact plug. The method may further include forming plug spacers to fill the gap. A top surface of the plug spacer may positioned at a level equal to or lower than a top surface of the first contact plug. The forming of the second interlayer dielectric layer may include forming an interlayer dielectric layer over a surface of a resultant structure including the bit line structure, and performing a planarization process on the interlayer dielectric layer until a top surface of the bit line structure is exposed. A width of the first sacrificial spacer may be equal to or greater than a width of the second sacrificial spacer. The first sacrificial spacer and the capping support layer may include an insulating substance, and the second sacrificial spacer may include a metal-containing substance. The first sacrificial spacer, the capping support layer, and the second sacrificial spacer may have a ring-shaped structure. The method may further include extending a bottom part of the second open part by etching the first interlayer dielectric layer under the second open part before forming the second contact plug. The method may further include forming a temporary capping layer over the first air gap before forming the third interlayer dielectric layer. The temporary capping layer and the first sacrificial spacer may be formed by the same substance. The method may further include forming a memory element coupled to the third contact plug. The method may further include forming a buried word line in the substrate before forming the first interlayer dielectric layer. The forming of the second open part may include forming a mask pattern overlapping with the buried word line over the second interlayer dielectric layer, and etching the second interlayer dielectric layer using the mask pattern.

DETAILED DESCRIPTION

Figure 1:
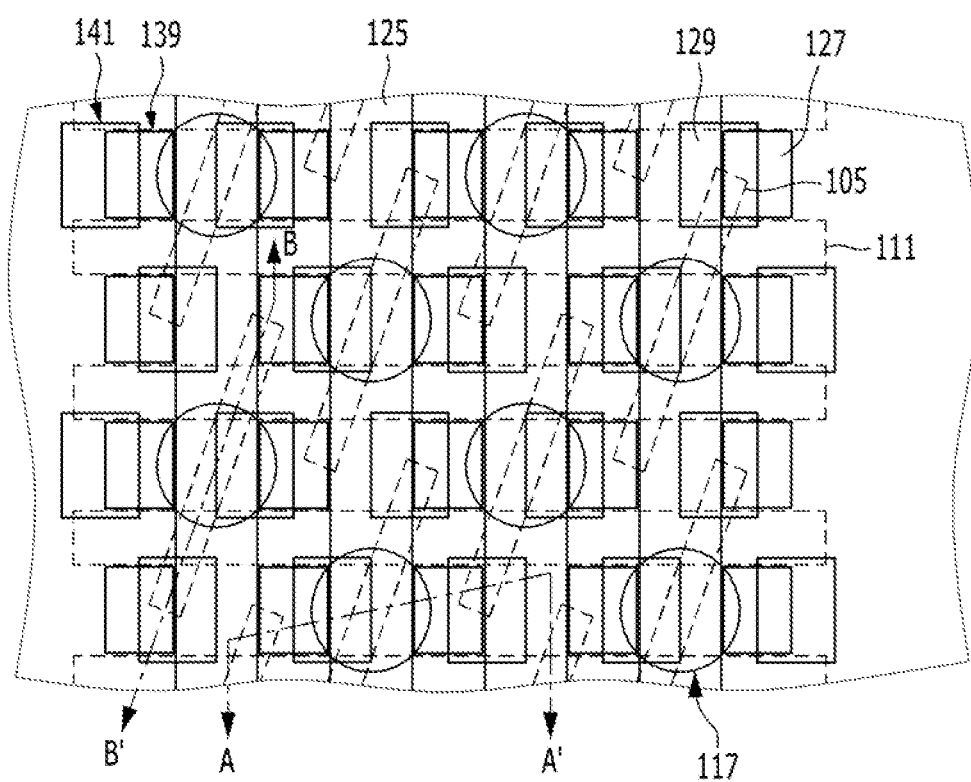
FIG. 1 is a plan view illustrating a semiconductor device in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and, in some instances, proportions may have been exaggerated to clearly illustrate features of the embodiments. When a first layer is referred to as being "on" a second layer or "on" a substrate, it not only refers to where the first layer is formed directly on the second layer or the substrate but also to where a third layer exists between the first layer and the second layer or the substrate.

Embodiments of the present invention to be described below provide a semiconductor device capable of reducing parasitic capacitance between adjacent conductive structures and a method of fabricating the same. For example, in a semiconductor memory device such as DRAM, due to a structure of memory cells, parasitic capacitance is inevitably formed between contacts adjacent to a bit line, wires, and adjacent bit lines. Such parasitic capacitance is one of the major causes of degraded performance characteristics as integration is increased. In order to reduce parasitic capacitance, a method of forming air gaps near a bit line has been proposed. As the width (or volume) of an air gap is increased, parasitic capacitance may be reduced. However, increasing the width of the air gap is limited due to difficulty in a capping process for sealing the entry of the air gap.

Accordingly, the following embodiments of the present invention provide a semiconductor device including a capping support layer, which may reduce parasitic capacitance by increasing the width (or volume) of an air gap and also facilitate an air gap capping process, and a method of fabricating the same.

Figure 2:
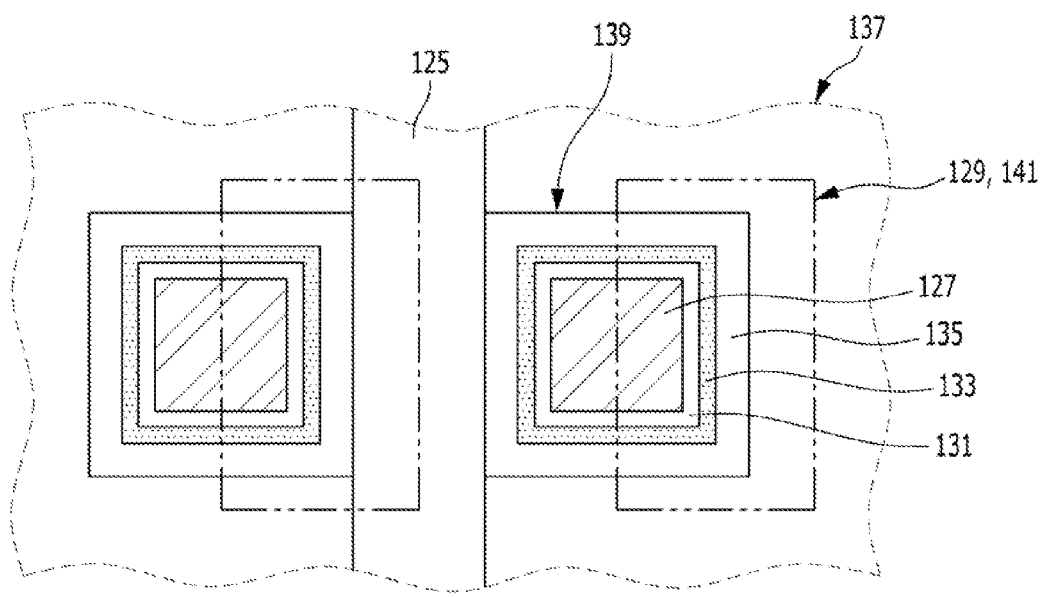
FIG. 2 is a plan view illustrating portions of air gaps in the semiconductor device of FIG. 1.
Figure 3A:
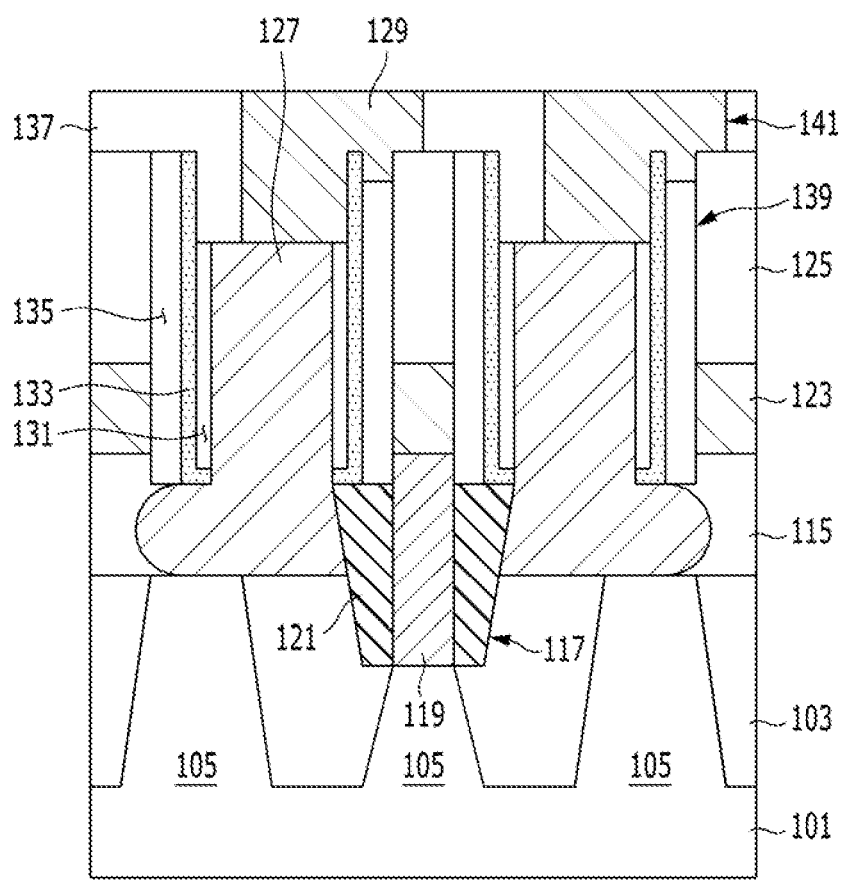
FIGS. 3A and 3B are cross-sectional views illustrating the semiconductor device taken along lines A-A' and B-B' of FIG. 1.
Figure 3B:
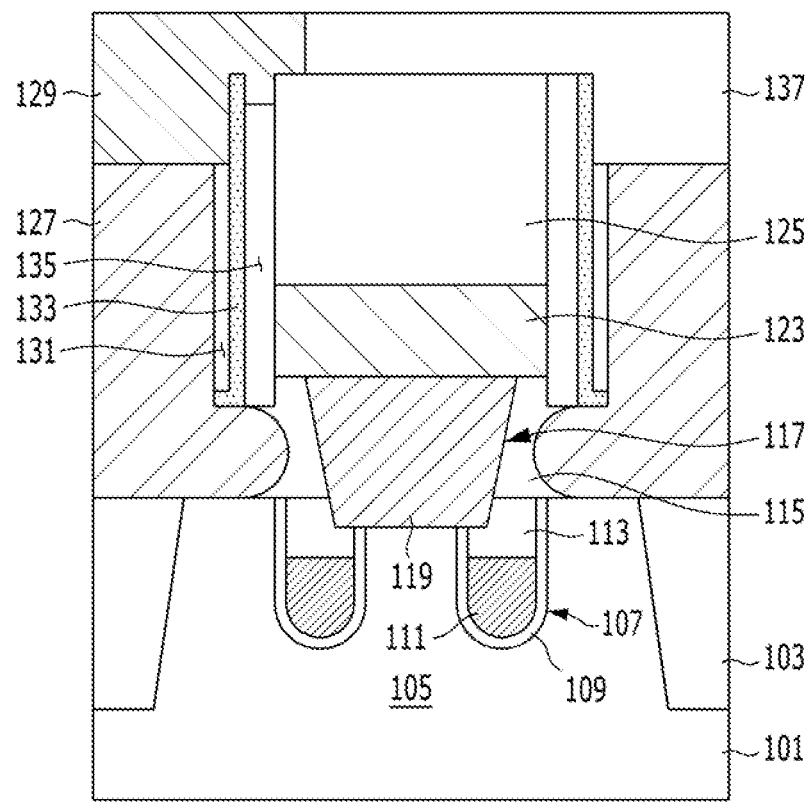

FIGS. 1, 2, 3A, and 3B are diagrams illustrating a semiconductor device in accordance with an embodiment of the present invention. More specifically, FIG. 1 is a plan view illustrating the semiconductor device, FIG. 2 is an enlarged plan view illustrating portions of air gaps in the semiconductor device of FIG. 1, FIG. 3A is a cross-sectional view of the semiconductor device taken along line A-A' of FIG. 1, and FIG. 3B is a cross-sectional view of the semiconductor device taken along line B-B' of FIG. 1.

As illustrated in FIGS. 1, 2, 3A, and 3B, the semiconductor device in accordance with the embodiment may include a bit line structure, a second contact plug 127, an air gap structure, a third contact plug 129, and a capping layer. The bit line structure may include a bit line 123 formed on a first contact plug 119. The second contact plug 127 may be formed adjacent to the first contact plug 119 and the bit line structure. The air gap structure may include two or more air gaps 131 and 135 configured to surround the second contact plug 127 and have an outer sidewall in contact with the bit line structure, and one or more capping support layers 133 configured to separate the air gaps 131 and 135. The capping layer may cap a part of the air gap structure, and gap-fill a space between the third contact plugs 129. The third contact plug 129 may be formed on the second contact plug 127 and cap a remainder of the air gap structure. In this case, all of the two or more air gaps 131 and 135 and the one or more capping support layers 133 may have a ring-shaped structure. Furthermore, the two or more air gaps 131 and 135 may have the same width, and the widths of the two or more air gaps 131 and 135 may be increased as the two or more air gaps 131 and 135 become distant (i.e. as the air gaps increase their distance) from the second contact plug 127.

The elements of the semiconductor device in accordance with the embodiment are described in more detail below. For convenience of description, the air gap structure is illustrated as including a first air gap 131, a second air gap 135, and a single capping support layer 133.

The semiconductor device in accordance with the embodiment may include isolation layers 103 formed in a substrate 101 to define a plurality of active regions 105. The substrate 101 may include a silicon-containing material of a single crystalline state. For example, the substrate 101 may include a silicon substrate, a silicon germanium substrate, or a silicon-on-insulator (SOI) substrate. Each of the plurality of active regions 105 may have an island-shaped structure configured to have a long axis and a short axis or a line-shaped structure extended in one direction. The isolation layer 103 may be formed by a Shallow Trench Isolation (STI) process.

The semiconductor device in accordance with the embodiment may include buried gate type transistors formed in the substrate 101. The buried gate type transistor may include a gate trench 107 formed in the substrate 101, a gate insulating layer 109 formed on a surface of the gate trench 107, a gate electrode 111 formed on the gate insulating layer 109 to fill a lower part of the gate trench 107, a gate sealing layer 113 formed on the gate electrode 111 to fill an upper part of the gate trench 107, and junction regions (not illustrated) formed in the active region 105, that is, a source region and a drain region. The gate trench 107 may have a line-shaped structure that intersects the plurality of active regions 105 and the isolation layers 103. The depth of the gate trench 107 formed in the active region 105 may be equal to or less than that of the gate trench 107 formed in the isolation layer 103. The gate insulating layer 109 may include at least one selected from a high-k substance, oxide, nitride, and oxynitride. The high-k substance may be an insulating substance having a higher dielectric constant than oxide or nitride. For example, the high-k substance may be at least one selected from metal oxide such as hafnium oxide and aluminum oxide. The gate electrode 111 may serve as a buried word line in the substrate 101. The gate electrode 111 may include a metal-containing substance. The metal-containing substance may include metal such as titanium, tantalum, or tungsten. The metal-containing substance may include at least any one selected from the group consisting of tantalum nitride, titanium nitride, tungsten nitride, and tungsten. The gate sealing layer 113 serves to protect the gate electrode 111, and may include an insulating substance.

The semiconductor device in accordance with the embodiment may include a first interlayer dielectric layer 115 formed on the substrate 101, a first open part 117 formed in the first interlayer dielectric layer 115, the first contact plug 119 formed in the first open part 117, and plug spacers 121 formed on sidewalls of the first contact plug 119 to gap-fill the remaining first open part 117. The first open part 117 provides a space where the first contact plug 119 for electrically coupling the bit line structure and the buried gate type transistor will be formed. Accordingly, the first open part 117 may have a substrate 101, corresponding to a central part of the active region 105 between the gate electrodes 111, that is exposed. The first open part 117 may have a diameter greater than the short axis of the active region 105. The first contact plug 119 may be a contact plug of the bit line 123. The first contact plug 119 may have the same line width as the bit line structure and may have a line width less than the diameter of the first open part 117. Accordingly, a gap may be present between the first open part 117 and the first contact plug 119. The plug spacers 121 may be formed on the sidewalls of the first contact plug 119 to fill the gap. Accordingly, the plug spacers 121 may have a pillar structure. The plug spacers 121 may be placed on both sides of the first contact plug 119 in the direction in which the gate electrode 111 is extended. That is, the plug spacers 121 may be formed on the sidewalls of the first contact plug 119 that face sidewalls of the second contact plug 127. The top surface of the plug spacer 121 may be positioned at a level equal to or lower than the top surface of the first contact plug 119. The reason for this is to enable the air gap structure to be placed in the bit line structure, in particular, on the sidewalls of the bit line 123. The plug spacers 121 may prevent a short between the second contact plug 127 and the first contact plug 119.

The semiconductor device in accordance with the embodiment may include the bit line structure formed on the first interlayer dielectric layer 115 in contact with the first contact plug 119. The bit line structure may include the bit line 123 and a bit line hard mask 125 on the bit line 123. The bit line 123 may be electrically coupled to a junction region, for example, the source region of the buried gate type transistor through the first contact plug 119. The bit line 123 may include a metal-containing substance. The bit line hard mask 125 may include an insulating substance.

The semiconductor device in accordance with the embodiment may include the second contact plugs 127 each contacting an edge of the active region 105, and the air gap structure configured to surround the second contact plug 127. The second contact plug 127 and the air gap structure may be formed in a second open part 139 defined by the bit line structure and a second interlayer dielectric layer (not illustrated). The second interlayer dielectric layer that defines the second open part 139 may have a line pattern overlapping with the gate electrode 111. Accordingly, the second open part 139 may have a hole-shaped structure. The second contact plug 127 may be a storage node contact plug. The second contact plug 127 may contact the edge of the active region 105. A bottom part of the second contact plug 127 under the air gap structure may have a laterally extended structure. The air gap structure may include the first air gap 131 configured to have a ring-shaped structure and surround the second contact plug 127, the second air gap 135 configured to have a ring-shaped structure and surround the first air gap 131, and the capping support layer 133 inserted between the first air gap 131 and the second air gap 135 to separate them, surround the first air gap 131, and have a ring-shaped structure. The first air gap 131 and the second air gap 135 serve to increase a total width (or volume) of air gaps. The reason why the first air gap 131 and the second air gap 135 have a ring-shaped structure that surrounds the second contact plug 127 is to more effectively reduce parasitic capacitance between the second contact plug 127 and the bit line structure within a limited area. The outer sidewall of the second air gap 135 may contact the bit line structure. The width of the first air gap 131 may be equal to or less than that of the second air gap 135. The reason for this is to prevent a sacrificial spacer from remaining in a process of forming air gaps by removing the sacrificial spacer. The capping support layer 133 may serve to control the width by dividing an air gap into the first air gap 131 and the second air gap 135 so that a capping process for the air gap is facilitated. The capping support layer 133 may include an insulating substance.

The semiconductor device in accordance with the embodiment may include a third interlayer dielectric layer 137 configured to cap the part of the air gap structure and define a third open part 141, and the third contact plug 129 configured to gap-fill the third open part 141 to cap the remainder of the air gap structure. The third interlayer dielectric layer 137 may serve as the capping layer of the air gap structure. The third contact plug 129 may be coupled to the second contact plug 127, and serve as a storage node contact plug. The third contact plug 129 may be formed by the same substance as the second contact plug 127 or may be formed by a substance having a smaller resistance value than that of the second contact plug 127.

Although not illustrated, the semiconductor device in accordance with the embodiment may include a memory element formed on the third contact plug 129. The memory element may be implemented in various forms. For example, the memory element may include a capacitor or a variable resistor. The variable resistor may include a phase change substance, transfer metal oxide, or a Magnetic Tunnel Junction (MTJ).

The semiconductor device in accordance with an embodiment includes the two or more air gaps 131 and 135 and the one or more capping support layers 133. Accordingly, parasitic capacitance may be reduced because a total width (or volume) of air gaps is increased, and air gaps may be easily capped because the width of each air gap is reduced.

Hereinafter, a method of fabricating the semiconductor device in accordance with an embodiment is described below with reference to FIGS. 4A to 4I and FIGS. 5A to 5I.

FIGS. 4A to 4I and 5A to 5I are cross-sectional views explaining a method of fabricating a semiconductor device in accordance with an embodiment of the present invention. FIGS. 4A to 4I show cross-sectional views of the semiconductor device taken along line A-A' of FIG. 1, and FIGS. 5A to 5I show cross-sectional views of the semiconductor device taken along line B-B' of FIG. 1.

Figure 4A:
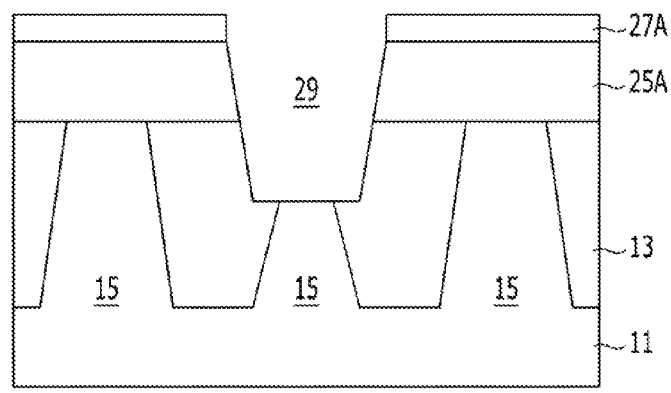
FIGS. 4A to 4I are cross-sectional views explaining a method of fabricating a semiconductor device in accordance with an embodiment of the present invention.
Figure 5A:
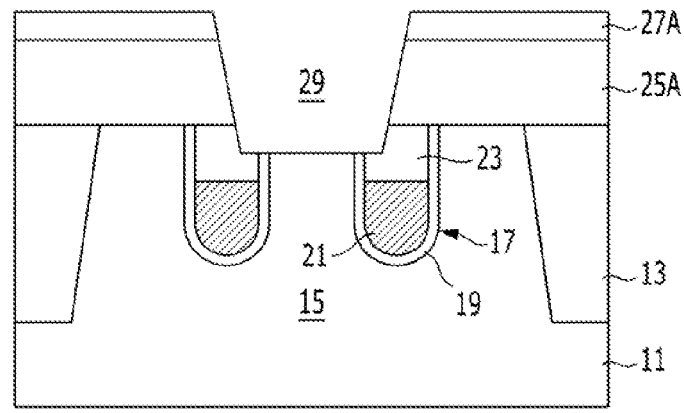
FIGS. 5A to 5I are cross-sectional views explaining a method of fabricating a semiconductor device in accordance with an embodiment of the present invention.

As illustrated in FIGS. 4A and 5A, isolation layers 13 defining a plurality of active regions 15 are formed in a substrate 11. The substrate 11 may include a silicon-containing material of a single crystalline state. For example, the substrate 11 may include a silicon substrate, a silicon germanium substrate, or an SOI substrate. The isolation layer 13 may be formed by a Shallow Trench Isolation (STI) process. For example, the isolation layer 13 may be formed by a series of processes for forming isolation trenches (not illustrated) in the substrate 11 and gap-filling the isolation trenches with an insulating substance. Each of the plurality of active regions 15 defined by the isolation layers 13 may have an island-shaped structure having a short axis and a long axis.

After forming gate trenches 17 by selectively etching the substrate 11, a gate insulating layer 19 is formed on a surface of each of the gate trenches 17. The gate trenches 17 may be formed in a line-shaped structure extended in one direction by simultaneously etching the substrate 11 and the isolation layers 13 of the active region 15. The depth of gate trench 17 formed in the active region 15 may be equal to or less than that of the gate trench 17 formed in the isolation layer 13.

The gate insulating layer 19 may be formed through a thermal oxidation process. In another embodiment, the gate insulating layer 19 may be formed by Chemical Vapor Deposition (CVD) process or Atomic Layer Deposition (ALD) process. The gate insulating layer 19 may include at least one selected from a high-k substance, oxide, nitride, and oxynitride. The high-k substance may be an insulating substance having a higher dielectric constant than oxide or nitride. For example, the high-k substance may be at least one selected from metal oxide such as hafnium oxide and aluminum oxide.

Next, a gate electrode 21 burying a lower part of each of the gate trenches 17 is formed on the gate insulating layer 19. The gate electrode 21 may serve as a buried word line. The gate electrode 21 may be formed by forming a metal-containing substance to fill the gate trenches and etching back the metal-containing substance. The metal-containing substance may include a substance including metal such as titanium, tantalum, or tungsten. The metal-containing substance may include at least any one selected from the group consisting of tantalum nitride, titanium nitride, tungsten nitride, and tungsten. For example, the gate electrode 21 may be formed to have a dual-layer structure, such as TiN/W in which tungsten is stacked on titanium nitride. In another embodiment, the gate electrode 21 may include metal that controls a work function.

Next, a gate sealing layer 23 burying an upper part of each of the gate trenches 17 is formed on the gate electrode 21. The gate sealing layer 23 serves to protect the gate electrode 21 and may include an insulating substance. Next, junction regions, that is, a source region (not illustrated) and a drain region (not illustrated), are formed in the active region 15.

Accordingly, a buried gate type transistor that includes the gate trenches 17, the gate insulating layers 19, the gate electrodes 21 serving as buried word lines, the gate sealing layers 23, and the junction regions may be formed.

Next, a first interlayer dielectric layer is formed on a resultant structure including the substrate 11, and an etch-stop layer is formed on the first interlayer dielectric layer. The first interlayer dielectric layer and the etch-stop layer may be formed by insulating substances having a mutual etch selectivity. For example, the first interlayer dielectric layer may include oxide, and the etch-stop layer may include nitride.

A first open part 29 is formed by selectively etching the first interlayer dielectric layer and the etch-stop layer. Accordingly, a first interlayer dielectric layer 25A and an etch-stop layer 27A are formed. The first open part 29 may be formed to partially expose the active region 15. More specifically, the first open part 29 may be formed to expose a central part of the active region 15 between the gate electrodes 21. The active region 15 exposed by the first open part 29 may include any one of the source region and drain region of the buried gate type transistor. The first open part 29 may have a diameter greater than the width of the short axis of the active region 15. Accordingly, in an etch process for forming the first open part 29, the isolation layers 13 and the gate sealing layer 23 may also be partially etched.

Figure 4B:
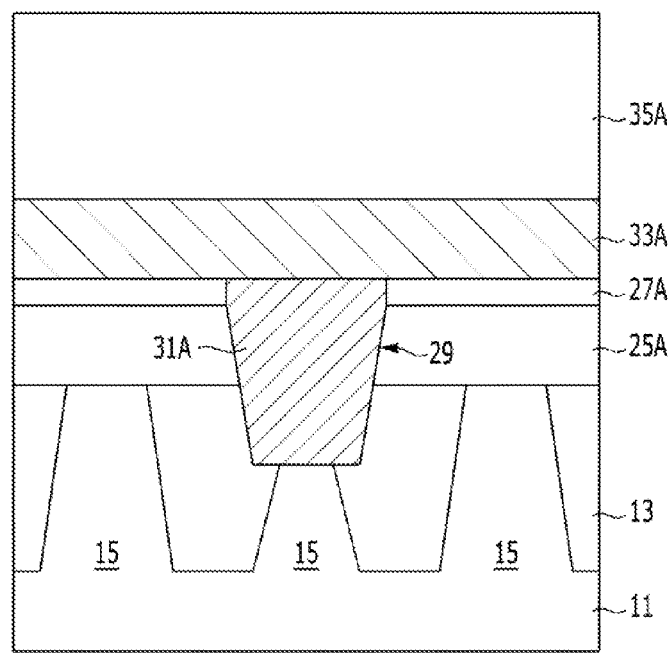
Figure 5B:
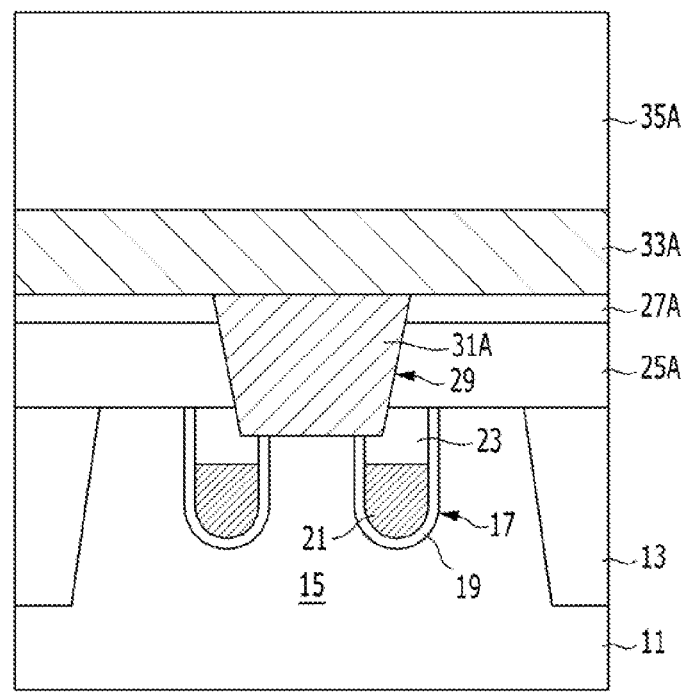

As illustrated in FIGS. 4B and 5B, a preliminary-first contact plug 31A is formed. More specifically, the preliminary-first contact plug 31A may be formed by forming a first conductive layer (not illustrated) on a resultant structure including the first open part 29 to gap-fill the first open part 29, and performing a planarization process on the first conductive layer until a top surface of the etch-stop layer 27A is exposed. The first conductive layer may include a silicon-containing substance. For example, the first conductive layer may include polysilicon. The planarization process may be performed by a chemical mechanical polishing (CMP) process. Next, impurities for improving conductivity may be doped into the preliminary-first contact plug 31A using a doping process such as dopant ion implantation.

Next, a second conductive layer 33A and a hard mask layer 35A are sequentially formed over the preliminary-first contact plug 31A. The second conductive layer 33A may include a metal-containing substance, and the hard mask layer 35A may include an insulating substance.

Figure 4C:
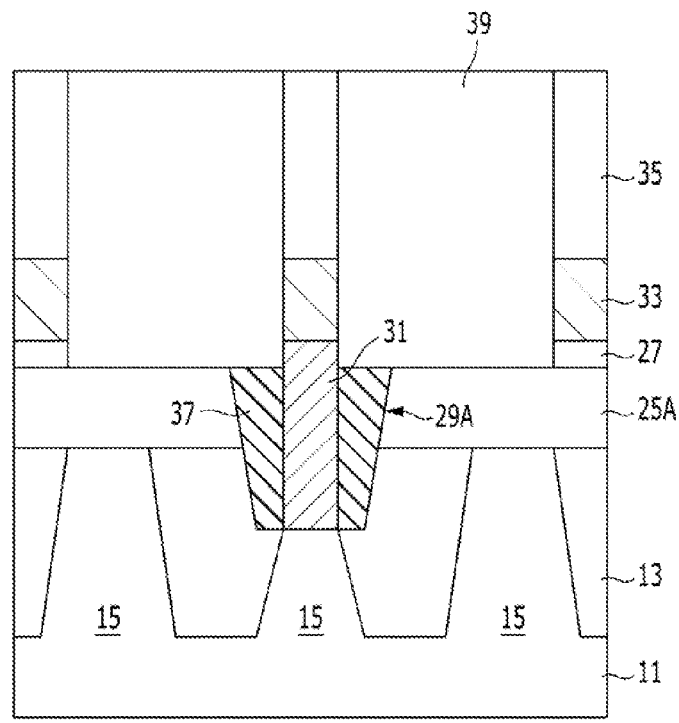
Figure 5C:
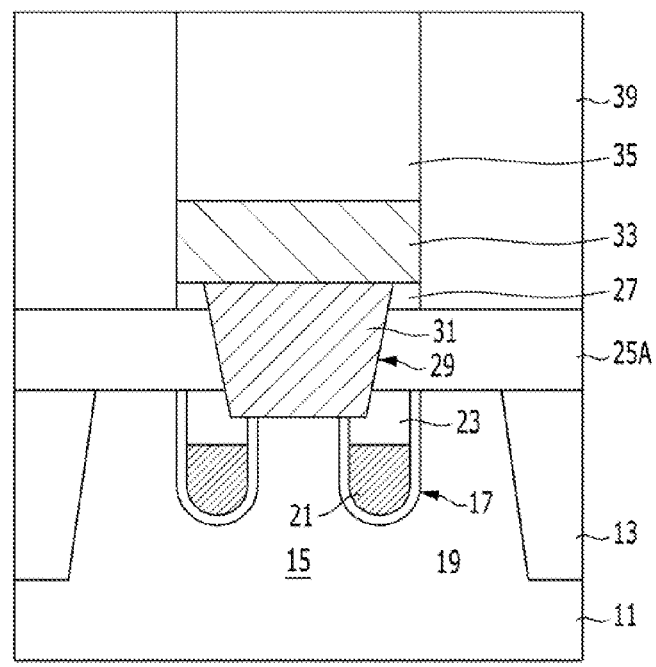

As illustrated in FIGS. 4C and 5C, a bit line structure is formed. More specifically, the bit line structure may be formed by selectively etching the hard mask layer 35A and the second conductive layer 33A until the top surface of the etch-stop layer 27A is exposed. Accordingly, a bit line 33 and a bit line hard mask 35 are formed, which form the bit line structure.

The etch-stop layer 27A is etched using the bit line hard mask 35. Accordingly, an etch-stop layer 27 may be formed to have the same line width as the bit line 33. Next, a first contact plug 31 is formed by etching the preliminary-first contact plug 31A. The first contact plug 31 may be formed to have the same line width as the bit line 33.

The line width of the first contact plug 31 is less than the diameter of the first open part 29 because the first contact plug 31 is formed to have the same line width as the bit line 33. Accordingly, gaps 29A are formed between the first open part 29 and the first contact plug 31. That is, a part of the first open part 29 is open again due to the gaps 29A after the first contact plug 31 is formed. The gaps 29A are not formed between the first open part 29 and the first contact plug 31 in the direction in which the bit line 33 is extended. Accordingly, the gaps 29A are formed between the first open part 29 and the first contact plug 31 in the direction in which they cross the bit line 33.

Next, plug spacers 37 may be formed on sidewalls of the first contact plug 31 to fill the gaps 29A. The plug spacers 37 may include an insulating substance. More specifically, the plug spacers 37 may be formed by a series of processes for forming a spacer insulating layer (not illustrated) on a resultant structure to fill the gaps 29A and recessing the spacer insulating layer. In this case, the recessing may be performed by an etch-back process.

A top surface of the plug spacers 37 may be controlled to be positioned at a level lower than a bottom surface of the bit line structure. More specifically, the plug spacers 37 are not formed on the sidewalls of the first contact plug 31, but are not formed on the sidewalls of the bit line 33. Each of the plug spacers 37 may have a pillar structure that fills the gap 29A. The plug spacers 37 may serve to prevent a multiple spacer for forming an air gap structure from being filled in the gaps 29A in a subsequent process. That is, the air gap structure may be prevented from being formed on the sidewalls of the first contact plug 31. For reference, when the air gap structure is formed on the sidewalls of the first contact plug 31, it is difficult to secure a sufficient contact area and a short may occur between the first contact plug 31 and a storage node contact plug to be formed in a subsequent process.

Furthermore, an open area between the bit line structures may be increased because the plug spacers 37 are not formed on the sidewalls of the bit line 33. Accordingly, the open area to form a second open part 43A through a subsequent process may be secured.

Next, after a second interlayer dielectric layer is formed on a resultant structure including the bit line structure to fill a space between the bit lines 33, a planarization process is performed on the second interlayer dielectric layer until a top surface of the bit line hard mask 35 is exposed. Accordingly, a second interlayer dielectric layer 39 is formed. The planarization process may be performed by a CMP process.

Figure 4D:
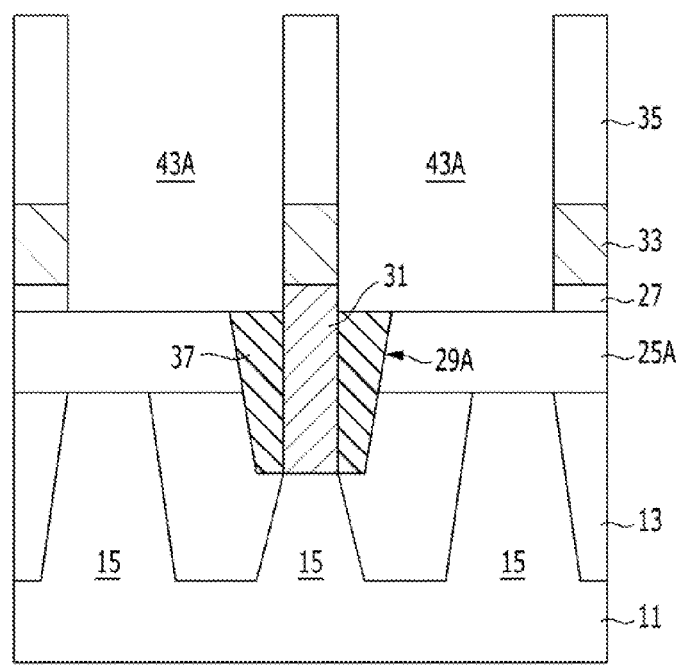
Figure 5D:
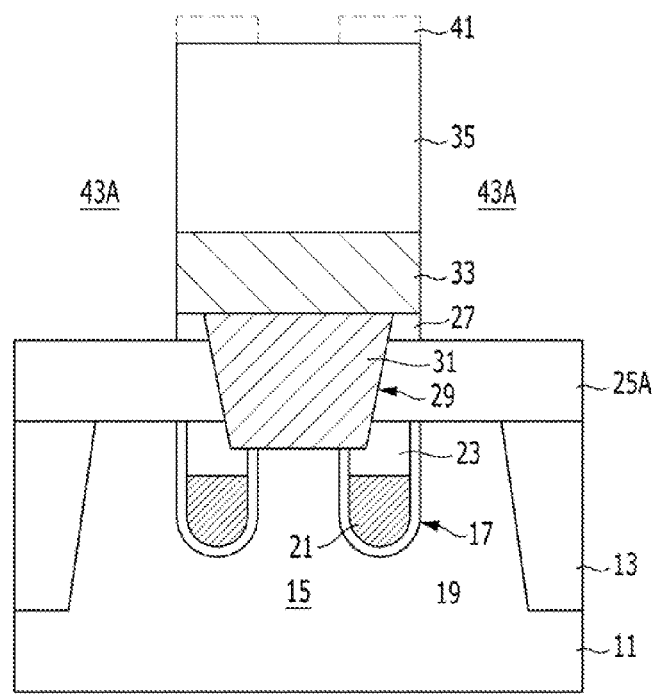

As illustrated in FIGS. 4D and 5D, a mask pattern 41 is formed on the second interlayer dielectric layer 39. The mask pattern 41 may have a line width equal to or greater than that of the gate electrode 21. When viewed on a plane, the mask pattern 41 may have a line-shaped structure overlapping with the gate electrodes 21.

The second interlayer dielectric layer 39 is etched using the mask pattern 41 until a top surface of the first interlayer dielectric layer 25A is exposed. The etched second interlayer dielectric layer 39 may serve as a plug separation layer for separating storage node contact plugs to be formed in a subsequent process in the direction in which the bit line 33 is extended. Next, the mask pattern 41 is removed.

Accordingly, there may be a second open part 43A configured to have a hole-shaped structure and have a sidewall provided by the second interlayer dielectric layer 39 in the direction in which the bit line 33 is extended and a sidewall provided by the bit line structure in the direction in which the gate electrodes 21 is extended. The second open part 43A may be a contact hole in which a storage node contact plug is to be formed.

Figure 4E:
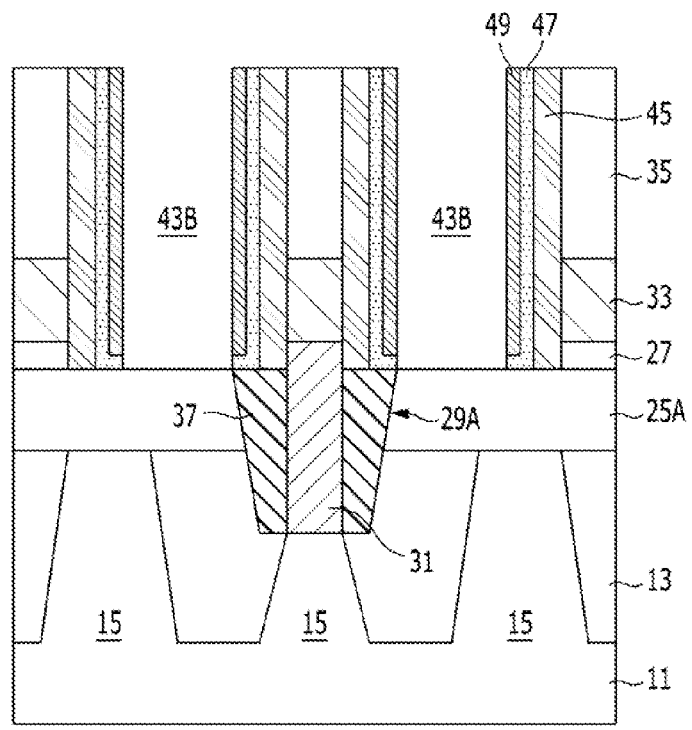
Figure 5E:
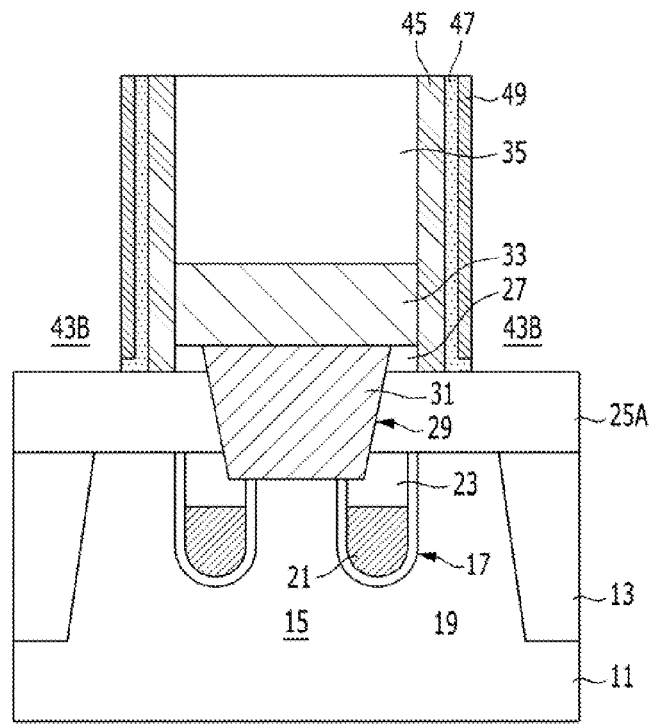

As illustrated in FIGS. 4E and 5E, a multiple spacer for forming the air gap structure is formed on the sidewalls of the second open part 43B. More specifically, the multiple spacer in which a first sacrificial spacer 45, a capping support layer 47, and a second sacrificial spacer 49 are sequentially stacked is formed on the sidewalk of the second open part 43B. The multiple spacer may have a ring-shaped structure. That is, the first sacrificial spacer 45, the capping support layer 47, and the second sacrificial spacer 49 may have a ring-shaped structure. The first sacrificial spacer 45 may have a width equal to or less than that of the second sacrificial spacer 49.

The multiple spacer may be formed by performing a single blanket-etch process, for example, an etch-back process after sequentially forming a plurality of substance layers. Furthermore, the multiple spacer may include the plurality of spacers individually formed by performing a process for depositing the substance layer and an etch-back process several times. For example, the multiple spacer may be formed using a method of forming the first sacrificial spacer 45 and then simultaneously forming the capping support layer 47 and the second sacrificial spacer 49. More specifically, the first sacrificial spacer 45 may be formed by a series of processes for forming a first sacrificial layer (not illustrated) having a constant thickness on a surface of a resultant structure including the second open part 43B and then performing an etch-back process. Subsequently, the capping support layer 47 and the second sacrificial spacer 49 may be formed by a series of processes for sequentially forming an insulating layer (not illustrated) and a second sacrificial layer (not illustrated) having a constant thickness on a surface of a resultant structure including the first sacrificial spacer 45 and then performing an etch-back process.

Each of the first sacrificial spacer 45, the capping support layer 47, and the second sacrificial spacer 49 may include a substance having an etch selectivity. More specifically, the first sacrificial spacer 45 and the capping support layer 47 may include an insulating substance, and the second sacrificial spacer 49 may include a metal-containing substance. For example, the first sacrificial spacer 45 may include silicon oxide, the capping support layer 47 may include silicon nitride, and the second sacrificial spacer 49 may include titanium nitride.

Figure 4F:
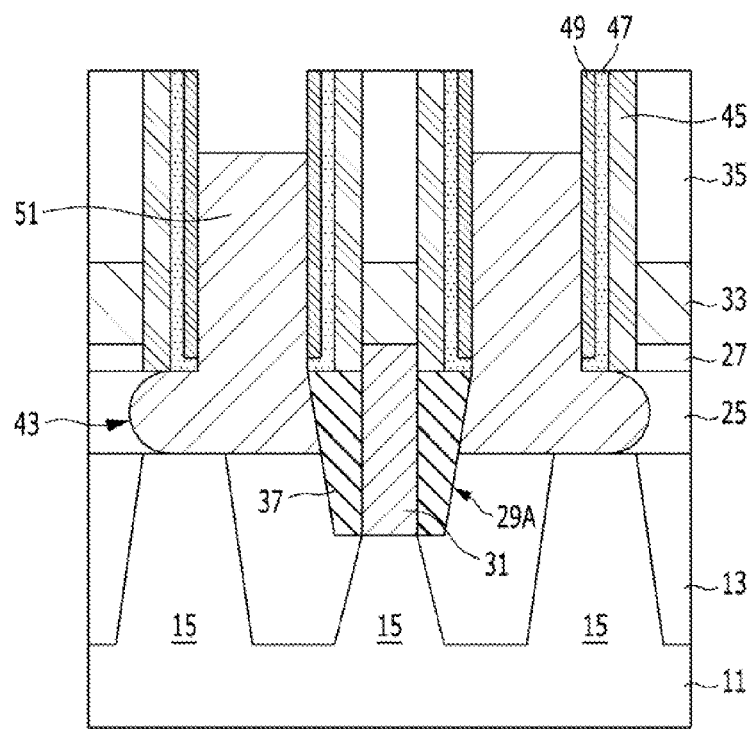
Figure 5F:
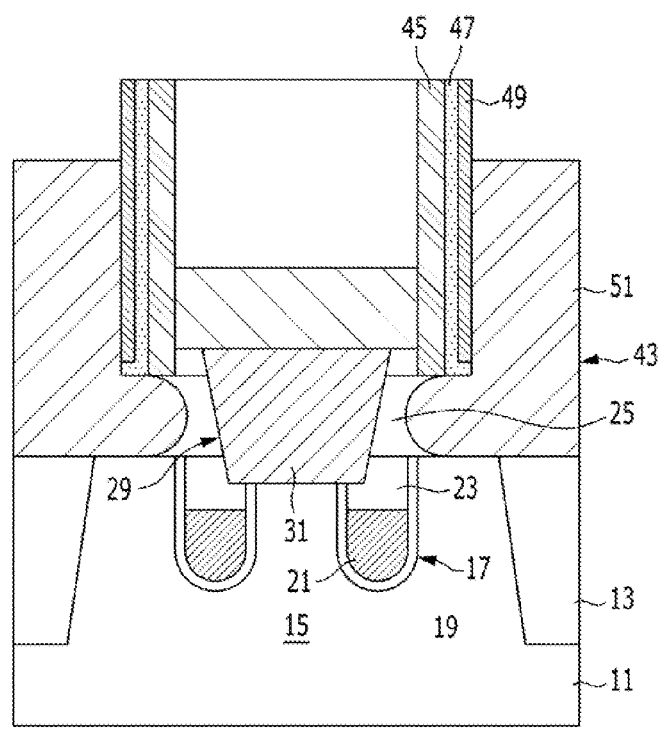

As illustrated in FIGS. 4F and 5F, a bottom part of the second open part 43B is extended by etching the first interlayer dielectric layer 25A under the second open part 43 including the multiple spacer. Accordingly, a first interlayer dielectric layer 25 and a second open part 43 are formed, and the active region 15 corresponding to the junction regions of the buried gate type transistor may be exposed. That is, an edge of the active region 15 may be exposed. The etch process may be performed on the first interlayer dielectric layer 25A using an isotropic etch process. Through such an isotropic etch process, the bottom part of the second open part 43 may be laterally extended, thus having a bulb-shaped structure. In this case, the etch process needs to be controlled not to expose the sidewalls of the first contact plug 31 due to the bottom part of the second open part 43. Since the bottom part of the second open part 43 is extended, the contact area of the second open part 43 may be sufficiently secured.

Next, a second contact plug 51 that partially gap-fills the second open part 43 is formed. The second contact plug 51 may be formed by depositing a conductive substance (not illustrated), planarizing the conductive substance to gap-fill the second open part 43, and then performing an etch-back process. The second contact plug 51 may be a storage node contact plug. The second contact plug 51 may include a silicon-containing substance. For example, the second contact plug 51 may include polysilicon, and polysilicon may be doped with impurities. The second contact plug 51 may be connected to a junction region of the buried gate type transistor, for example, the drain region. The top surface of the second contact plug 51 may be positioned at a level higher than the top surface of the bit line 33.

Figure 4G:
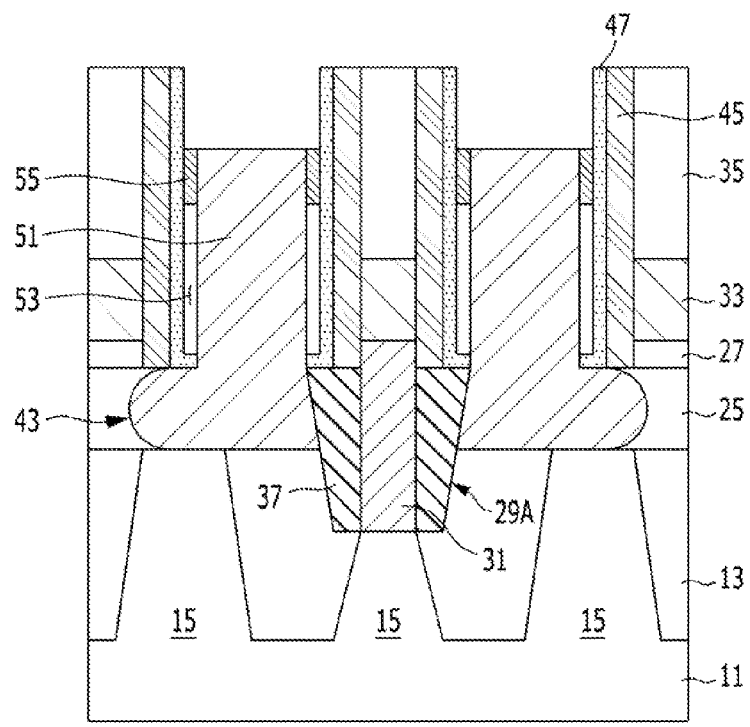
Figure 5G:
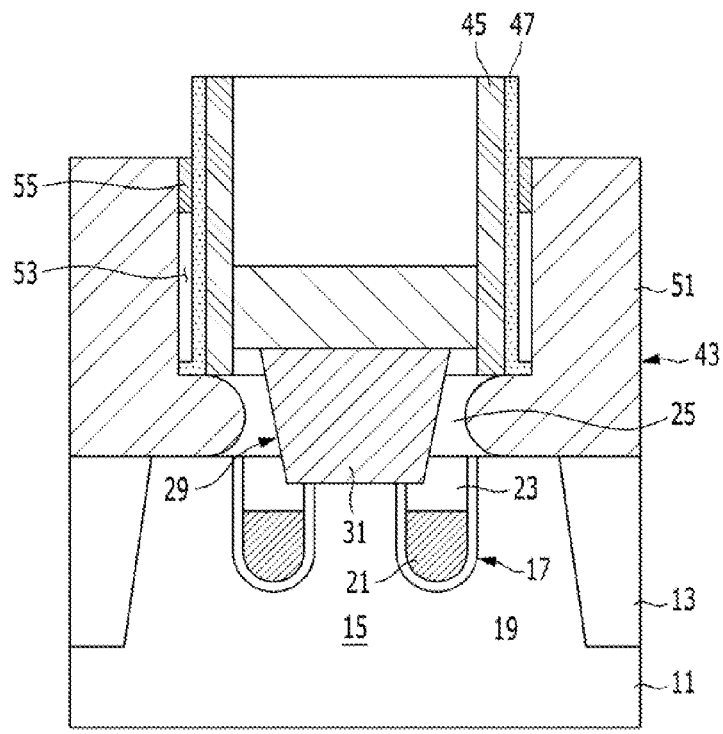

As illustrated in FIGS. 4G and 5G, a first air gap 53 is formed by removing the second sacrificial spacer 49. The second sacrificial spacer 49 may be removed by wet etch. The first air gap 53 may have a ring-shaped structure that surrounds the second contact plug 51.

A temporary capping layer 55 that caps a top of the first air gap 53 is formed. The temporary capping layer 55 serves to prevent anything from filling the first air gap 53 in a subsequent process or to prevent a reduction in the volume of the first air gap 53. The temporary capping layer 55 may include an insulating substance. The temporary capping layer 55 may be formed using a method of forming an insulating layer (not illustrated) on a surface of a resultant structure including the first air gap 53 and then performing an etch-back process. The temporary capping layer 55 may be formed by the same substance as the first sacrificial spacer 45. The reason for this is to remove the temporary capping layer 55 in a subsequent process for removing the first sacrificial spacer 45. For example, the temporary capping layer 55 may include silicon oxide.

When the width of the first air gap 53 is small, for example, when the width of the first air gap 53 is less than that of a second air gap 61 to be formed in a subsequent process, the process for forming the temporary capping layer 55 may be omitted.

Figure 4H:
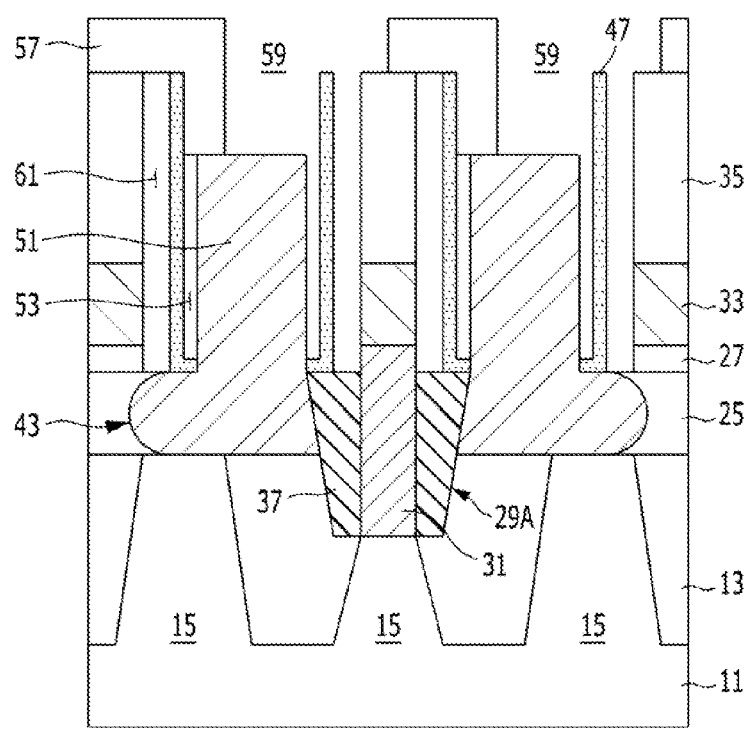
Figure 5H:
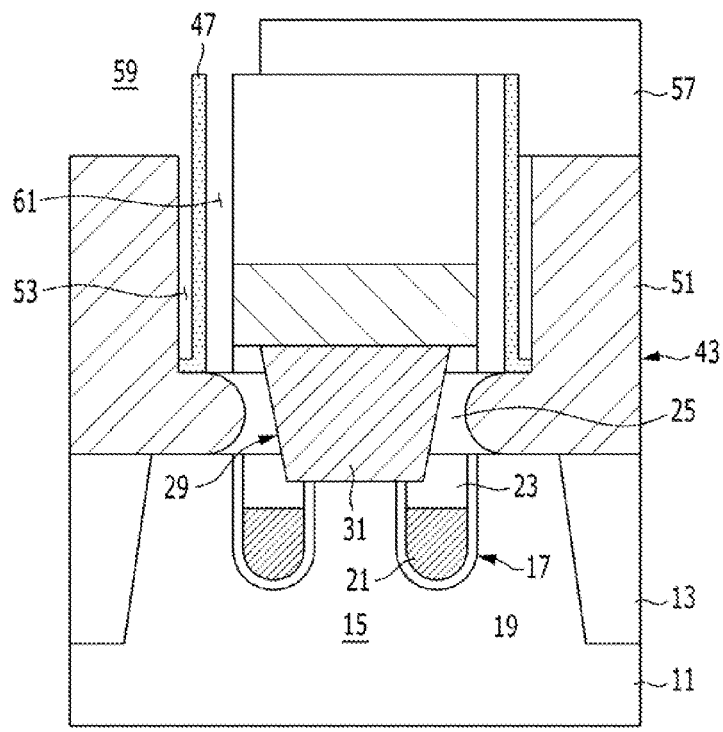

As illustrated in FIGS. 4H and 5H, after a third interlayer dielectric layer is formed on a resultant structure including the substrate 11, a third open part 59 which partially exposes the second contact plug 51, the first sacrificial spacer 45, and the temporary capping layer 55 is formed. Accordingly, a third interlayer dielectric layer 57 is formed, and the third interlayer dielectric layer 57 including the third open part 59 may serve as a capping layer which caps a part of the air gap structure.

Next, the second air gap 61 is formed by removing the first sacrificial spacer 45. The first sacrificial spacer 45 may be removed by wet etch. The second air gap 61 formed by removing the first sacrificial spacer 45 may have a ring-shaped structure that surrounds the second contact plug 51, the capping support layer 47, and the first air gap 53. Since the first sacrificial spacer 45 and the temporary capping layer 55 are formed by the same substance, the temporary capping layer 55 is removed in the etch process, thereby increasing the volume of the first air gap 53. Furthermore, the volume of the first air gap 53 may be further increased by removing residues within the first air gap 53.

In this case, when the width of the first air gap 53 is less than that of the second air gap 61, the second sacrificial spacer 49 may partially remain within the first air gap 53 because an etchant is not easily supplied to the first air gap 53. In the present embodiment, however, the second sacrificial spacer 49 may be prevented from partially remaining in the first air gap 53 because an etchant is also supplied to the first air gap 53 in the process for forming the second air gap 61.

Accordingly, the air gap structure, including the first air gap 53, the capping support layer 47, and the second air gap 61 may be formed.

Figure 4I:
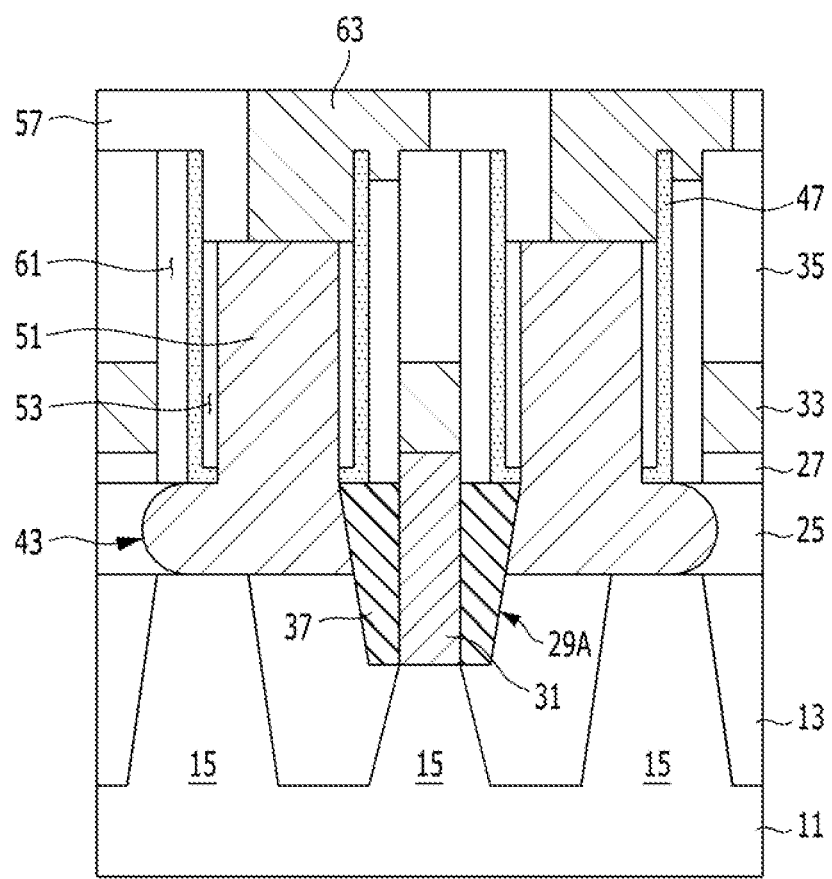
Figure 5I:
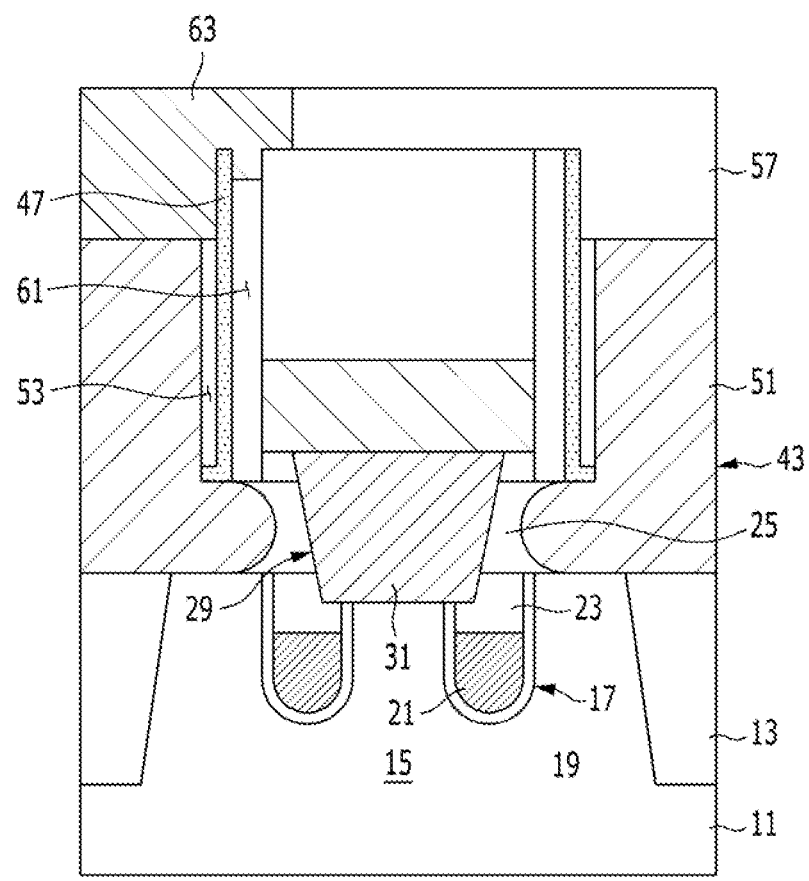

As illustrated in FIGS. 4I and 5I, a third contact plug 63 that gap-fills the third open part 59 is formed. The third contact plug 63, together with the second contact plug 51, may serve as a storage node contact plug. The third contact plug 63 may be formed by forming a conductive layer on a resultant structure to fill the third open part 59 and then performing a planarization process until a top surface of the third interlayer dielectric layer 57 is exposed. The third contact plug 63 may be formed by the same substance as the second contact plug 51 or may be formed by a substance having lower resistance than that of the second contact plug 51. For example, the third contact plug 63 may include a metal-containing substance.

The third contact plug 63 may cap a remainder of the air gap structure. The first air gap 53 and the second air gap 61 may be easily capped through the capping support layer 47. That is, although a total width of the air gaps including the first air gap 53 and the second air gap 61 is increased, the first air gap 53 and the second air gap 61 may be easily capped through the capping support layer 47.

Thereafter, although not illustrated, a memory element may be formed on the third contact plug 63. The semiconductor device may be completed using a known semiconductor fabrication technology.

The semiconductor device fabricated in accordance with the aforementioned embodiment may improve the electrical insulation properties of the bit line 33 and the storage node contact plug because it includes the air gap structure. For example, parasitic capacitance between the bit line 33 and the storage node contact plug may be reduced. The sensing margin of the semiconductor device may be improved because parasitic capacitance is reduced.

The semiconductor device in accordance with the aforementioned embodiments may be applied to Dynamic Random Access Memory (DRAM), but is not limited thereto. For example, the semiconductor device may be applied to a variety of types of memory, such as Static Random Access Memory (SRAM), flash memory, Ferroelectric Random Access Memory (FeRAM), Magnetoresistive Random Access Memory (MRAM), Phase Change Random Access Memory (PRAM), and Resistive Random Access Memory (ReRAM).

Figure 6:
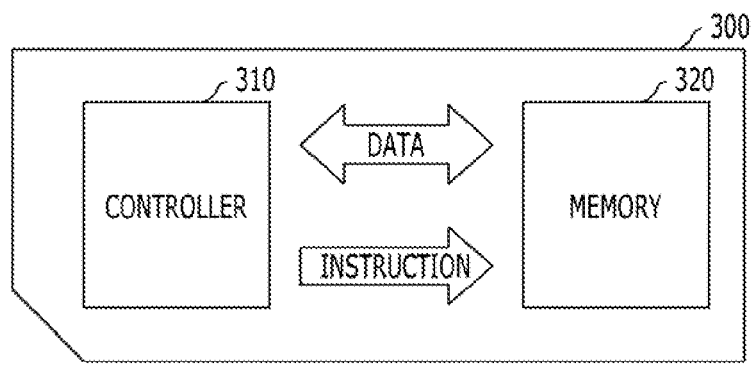
FIG. 6 is a block diagram illustrating a memory card.
Figure 7:
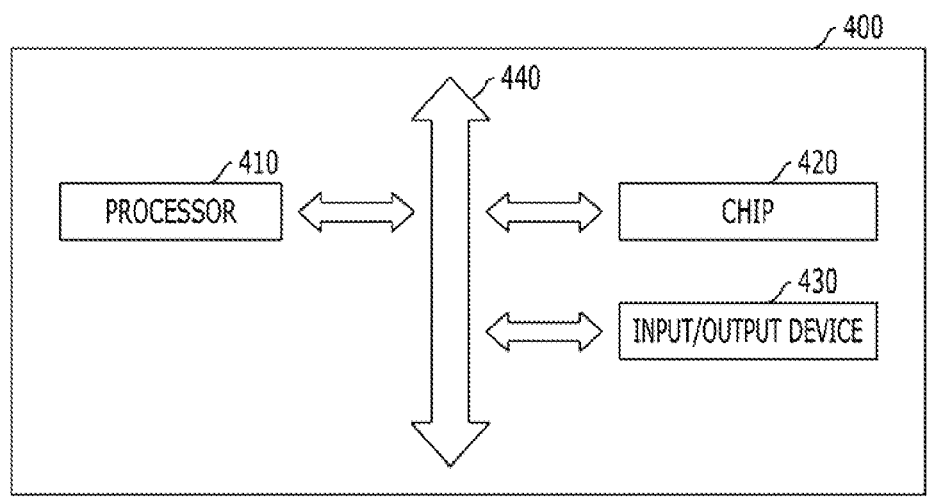
FIG. 7 is a block diagram illustrating an electronic system.

The semiconductor device in accordance with the aforementioned embodiments may be used in various electronic devices or systems. FIGS. 6 and 7 illustrate some examples of an electronic device or system which may be implemented using the semiconductor device in accordance with the aforementioned embodiments.

FIG. 6 is a block diagram illustrating a memory card.

Referring to FIG. 6, the memory card 300 may include a controller 310 and a memory 320. The controller 310 and the memory 320 may exchange electrical signals. For example, the memory 320 may exchange data with the controller 310 in response to an instruction from the controller 310. Accordingly, the memory card 300 may store data in the memory 320 or externally output data from the memory 320. The memory 320 may include the semiconductor device in accordance with an embodiment. The memory card 300 may be used as the data storage media of various portable devices.

FIG. 7 is a block diagram illustrating an electronic system.

Referring to FIG. 7, the electronic system 400 may include a processor 410, an input/output device 430, and a chip 420. The processor 410, the input/output device 430, and the chip 420 may perform data communication with one another using a bus 440. The processor 410 may execute a program and serve to control the electronic system 400. The input/output device 430 may be used to input or output the data to or from the electronic system 400. The electronic system 400 may be coupled to an external device, for example, a personal computer or a network using the input/output device 430 and may exchange data with the external device. The chip 420 may store code and data for an operation of the processor 410 and process some of an operation given by the processor 410. For example, the chip 420 may include the semiconductor device in accordance with an embodiment. The electronic system 400 may form various electronic control devices that require the chip 420.

In accordance with this technology a total width (or volume) of the air gaps may be increased because the plurality of air gaps and the capping support layer are included. Accordingly, parasitic capacitance may be reduced, and a capping process may be easily performed on the plurality of air gaps.

Although various embodiments have been described for illustrative purposes, it will be apparent to those skilled in the art that various changes and modifications may be made without departing from the spirit and scope of the invention as defined in the following claims.

What is claimed is:

1. A semiconductor device comprising:
   a bit line structure including a bit line formed over a first contact plug;
   a second contact plug formed adjacent to the first contact plug and the bit line structure;
   an air gap structure including two or more air gaps to surround the second contact plug and having an outer sidewall in contact with the bit line structure, and one or more capping support layers separating the air gaps;
   a third contact plug suitable for capping a part of the air gap structure and is formed over the second contact plug; and
   a capping layer suitable for capping a remainder of the air gap structure.

2. The semiconductor device of claim 1, wherein the two or more air gaps and the one or more capping support layers of the air gap structure have a ring-shaped structure.

3. The semiconductor device of claim 1, wherein the two or more air gaps of the air gap structure have the same width.

4. The semiconductor device of claim 1, wherein the capping support layer comprises an insulating substance.

5. The semiconductor device of claim 1, wherein a bottom part of the second contact plug is laterally extended.

6. The semiconductor device of claim 1, further comprising:
   a plug spacer formed over sidewalls of the first contact plug which face sidewalls of the second contact plug.

7. The semiconductor device of claim 6, wherein a top surface of the plug spacer is positioned at a level equal to or lower than a top surface of the first contact plug.

8. The semiconductor device of claim 1, further comprising:
   a buried gate type transistor having a source region and a drain region respectively coupled to the first contact plug and the second contact plug; and
   a memory element coupled to the third contact plug.

9. The semiconductor device of claim 8, wherein the memory element comprises a capacitor or a variable resistance element.

10. A semiconductor device comprising:
    a bit line structure comprising a bit line formed over a first contact plug;
    a second contact plug formed adjacent to the first contact plug and the bit line structure;
    a first air gap having a ring-shaped structure and surrounding the second contact plug;
    a second air gap having a ring-shaped structure to surround the first air gap, and having an outer sidewall in contact with the bit line structure;
    a capping support layer having a ring-shaped structure to surround the first air gap, and separating the first air gap from the second air gap;
    a third contact plug suitable for capping a part of the first air gap and the second air gap, and is formed over the second contact plug;
    a capping layer suitable for capping a remainder of the first air gap and the second air gap; and
    a memory element coupled to the third contact plug.

11. The semiconductor device of claim 10, wherein a width of the first air gap is equal to or less than a width of the second air gap.

12. The semiconductor device of claim 10, wherein the capping support layer comprises an insulating substance.

13. The semiconductor device of claim 10, wherein a bottom part of the second contact plug is laterally extended.

14. The semiconductor device of claim 10, further comprising:
    a plug spacer formed over sidewalls of the first contact plug which face sidewalls of the second contact plug.

15. The semiconductor device of claim 14, wherein a top surface of the plug spacer is positioned at a level equal to or lower than a top surface of the first contact plug.

16. The semiconductor device of claim 10, wherein the memory element comprises a capacitor or a variable resistance element.

* * * * *